US006140664A

United States Patent [19]

Seevinck et al.

[11] Patent Number: 6,140,664

[45] **Date of Patent: *Oct. 31, 2000**

[54] CATHODE RAY TUBE COMPRISING A SEMICONDUCTOR CATHODE

[75] Inventors: Evert Seevinck; Tjerk G. Spanjer, both of Eindhoven, Netherlands

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/408,088

[22] Filed: Mar. 21, 1995

Related U.S. Application Data

[63] Continuation of application No. 08/156,144, Nov. 22, 1993, abandoned.

[30] Foreign Application Priority Data

Dec. 8, 1992 [EP] European Pat. Off. .............. 92203813

[51] Int. Cl.[7] ...................... H01L 29/12

[52] U.S. Cl. ...................... 257/10; 313/366

[58] Field of Search ...................... 257/10, 11, 603; 313/366

[56] References Cited

U.S. PATENT DOCUMENTS

| | | | |
|---|---|---|---|
| 4,019,082 | 4/1977 | Olsen et al. | 257/10 |
| 4,259,678 | 3/1981 | Van Gorkom et al. | 257/10 |
| 4,303,930 | 12/1981 | Van Gorkom et al. | 257/10 |
| 4,682,074 | 7/1987 | Hoeberechts et al. | 257/10 |

FOREIGN PATENT DOCUMENTS

| | | | |
|---|---|---|---|
| 5864072 | 4/1983 | Japan | 257/10 |

*Primary Examiner*—Sara Crane
*Attorney, Agent, or Firm*—John C. Fox

[57] ABSTRACT

To prevent breakdown of an insulating layer located underneath a gate electrode, the gate electrode is connected to an external terminal via a high-ohmic resistor. The high-ohmic resistor may form part of a resistive network for biasing voltages for a plurality of gate electrodes. The resistive network may be realised partly on the insulating layer.

12 Claims, 4 Drawing Sheets

CATHODE RAY TUBE COMPRISING A SEMICONDUCTOR CATHODE

This is a continuation of application Ser. No. 08/156,144, filed Nov. 22, 1993 now abandoned.

BACKGROUND OF THE INVENTION

The invention relates to a cathode ray tube comprising at least one semiconductor cathode for generating an electron beam, a main surface of a semiconductor body of said cathode being provided with an electrically insulating layer having at least one aperture at the location of an electron-generating structure, at least one electrode for influencing the emissive electron beam being present on the electrically insulating layer.

The invention also relates to a semiconductor cathode for use in such a cathode ray tube.

A cathode ray tube of this type, provided with a "cold cathode" is known from U.S. Pat. No. 4,303,930. In the semiconductor device, which is a "cold cathode", a pn junction is reverse-biased in such a way that there is avalanche multiplication of charge carriers. Some electrons may then acquire as much kinetic energy as is necessary for exceeding the electron work function. The emission of these electrons is simplified by providing the semiconductor device with acceleration electrodes or gate electrodes on an insulating layer located on the main surface, which insulating layer leaves an aperture at the location of the emissive region. Emission is further simplified by providing the semiconductor surface at the location of the emissive region with a material reducing the work function such as, for example cesium.

If such a cathode is built into a cathode ray tube, problems occur in the further manufacturing process. During the process, in a conditioning step known as spot-knocking, a number of grids in the tube acquire a high to very high voltage (100 kV to 30 kV) while the substrate and the gate electrode(s) of the semiconductor cathode are, for example grounded. During this spot-knocking operation flashovers are produced so that the grid located closest to the cathode acquires a high voltage (approximately 10 to 30 kV) instead of a comparatively low voltage (approximately 100 V). Such a flashover may also occur during normal use.

The connection wires of the substrate as well as the gate electrodes cannot, however, be considered as purely ohmic connections but have a given inductance. This results in a large voltage difference between the substrate and the gate electrode due to capacitive crosstalk between said grid and, for example, this substrate. This voltage difference is also dependent on the inductances of the connection wires, the resistance of, for example, the material of the gate electrode and the duration of the flashover. Usually, this difference is, however, so large that there may be a destructive breakdown of the insulating layer between the gate electrode and the subjacent substrate. As a result, cathode ray tubes comprising this type of cold cathodes are often rejected, notably during the spot-knocking process.

OBJECTS AND SUMMARY OF THE INVENTION

It is, inter alia an object of the invention to provide a cathode ray tube in which a solution to the above-mentioned problem is obtained and by which the number of rejects during manufacture is reduced.

To this end a cathode ray tube according to the invention is characterized in that the electrode is connected to a terminal via a high-resistance resistor.

The invention is based, inter alia on the recognition that the gate electrode with the subjacent insulating material and the semiconductor material can be considered to be components of a divided RC network. By terminating this RC network with the high-ohmic resistor, the occurrence of voltages due to flashovers is considerably reduced and breakdown of the insulating layer is prevented.

If a plurality of semiconductor cathodes is used in a cathode ray tube (for example, three for the colours red, green and blue, respectively) which obtain the same voltage during use, a common connection via a high-resistance resistor can be chosen so as to economize on the number of connections. However, each cathode is preferably provided individually with the high-ohmic resistor which cathodes, if necessary, are connected via the same terminal so as to reduce the number of connections. The resistors then realise a substantially complete decoupling between the different cathodes so that there is substantially no crosstalk.

In a preferred embodiment the resistor forms part of a resistive network which is arranged on a support of ceramic material or glass on which the semiconductor cathodes are also arranged. The resistive network may comprise a resistive voltage divider (so that voltage division occurs during use) with which the voltages at different gate electrodes can be set at different values. If necessary, such a resistive voltage divider may also be realised on the layer of insulating material, for example by means of resistors of polycrystalline silicon.

A semiconductor device for use in such a cathode ray tube is characterized in that the electrically insulating layer of the semiconductor body comprises a resistive voltage divider having tappings which are connected in an electrically conducting manner to terminals of gate electrodes of the semiconductor cathode.

BRIEF DESCRIPTION OF THE DRAWING

These and other aspects of the invention will be apparent from and elucidated with reference to the embodiments described hereinafter.

In the drawings

FIG. 6 shows a modification of the embodiment of FIG. 3, while

The Figures are diagrammatical and not to scale. Corresponding elements generally have the same reference numerals.

DESCRIPTION OF THE PREFERRED EMBODIMENTS

Figure 1:
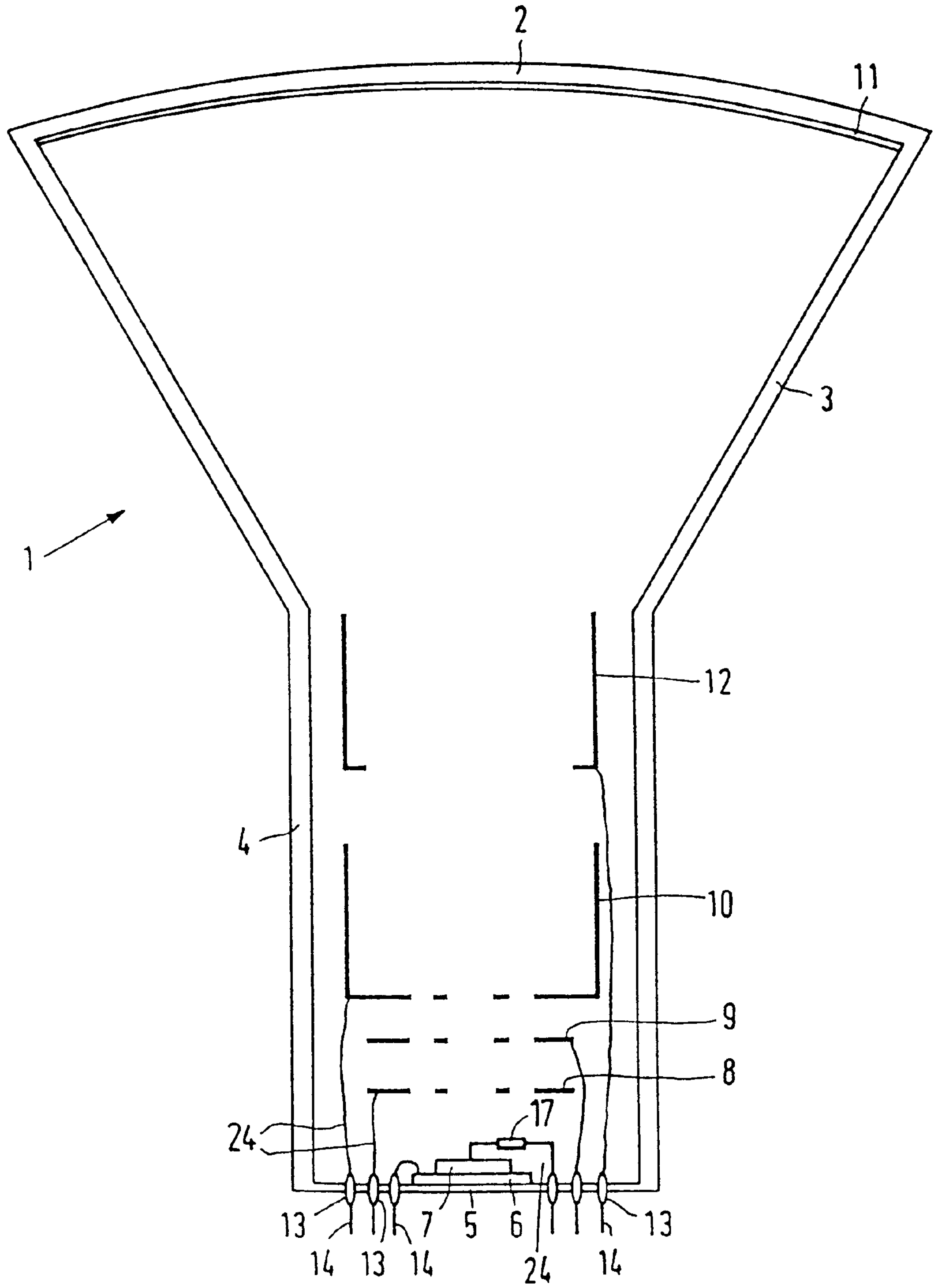
FIG. 1 shows diagrammatically a cathode ray tube according to the invention.

FIG. 1 shows diagrammatically a cathode ray tube 1 for picture display. This tube has a display window 2, a cone 3 and a neck portion 4 with an end wall 5. A support 6 with one or more cathodes 7, in this case semiconductor cathodes realised in a semiconductor body, is present on the inner side on the end wall 5. The neck portion 4 accommodates a plurality of (in this case four) grid electrodes 8, 9, 10 and 12. The cathode ray tube further has an anode 11 at the location of the display window and, if necessary, deflection electrodes (not shown). Further elements associated with such a cathode ray tube, such as deflection coils, shadow masks, etc. are omitted in FIG. 1 for the sake of simplicity. For electrical connection of, inter alia the cathode and the acceleration electrodes, the end wall 5 has leadthroughs 13 via which the connection wires for these elements are electrically interconnected to terminals 14.

In the manufacturing process the cathode ray tube is subjected to a process step known as spot-knocking so as to remove burrs and dust particles. In this process step, for example grid 12 acquires a high voltage (approximately 40 kV) while the other grid electrodes are provided with pulsed or non-pulsed voltages of approximately 30 kV. Then flashovers may occur so that due to capacitive crosstalk between, for example the grid electrode 8 and the surface of the semiconductor body and gate electrodes provided on this body, voltage peaks of approximately 100 V to approximately 2 kV are generated on this surface and on the gate electrodes (also because the associated connection wire behaves as an inductance with respect to these voltage peaks at the rate at which they are generated). During operation the cathode is usually grounded while the electrodes 8, 9, 10 and 12 are maintained at voltages of 100 V, 2 kV, 8 kV and 30 kV, respectively. Such flashovers may occur also during this normal use, although the voltages at the acceleration electrodes do not necessarily occur in a rising sequence, as viewed from the cathode.

If the semiconductor cathode comprises a gate electrode, as is described in U.S. Pat. No. 4,303,930, which is separated from the subjacent semiconductor surface by an insulating layer, there will easily be breakdown (the destructive breakdown voltage of such a layer may vary between approximately 200 V and approximately 300 V). Consequently, there may not only be a short-circuit between the gate electrode and the semiconductor body, but also silicon nitride which is associated with the insulating layer and is usually present to prevent absorption of cesium by silicon oxide may be attacked.

Figure 2:
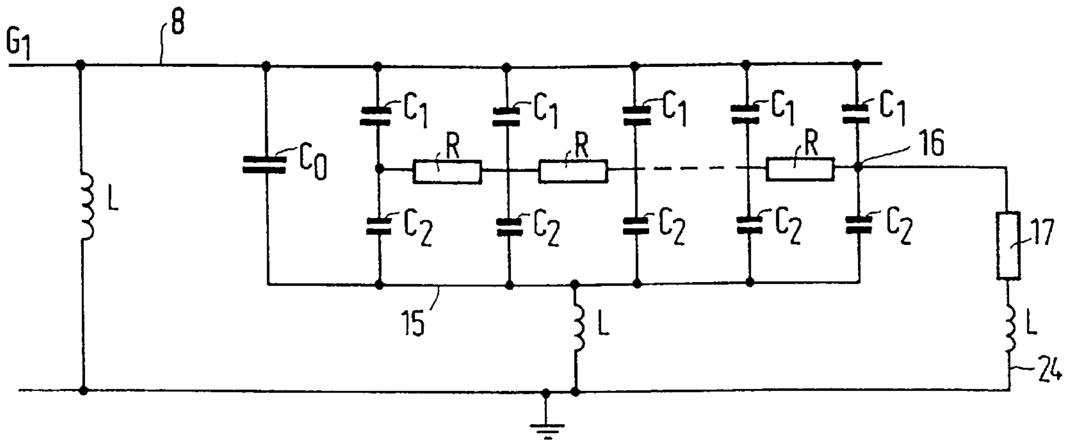
FIG. 2 shows a substitution diagram of a part of the cathode ray tube of FIG. 1.

FIG. 2 shows diagrammatically an electrical substitution diagram of a part of the cathode ray tube with the grid 8 (also denoted as $G_1$) diagrammatically shown as a solid line and a semiconductor cathode whose substrate is shown by means of the solid line 15. A gate electrode of, for example, polycrystalline silicon is present on the substrate and is separated from the substrate by an electrically insulating layer. This electrode is shown in FIG. 2 as a resistor divided into dividing resistors R. The capacitance between the grid electrode 8 and the substrate is denoted by $C_0$. Due to the resistive character of the gate electrode, the capacitance between the grid electrode 8 and this gate electrode may be considered to be a divided capacitance indicated by means of capacitances $C_1$. In the same manner, the capacitances $C_2$ represent a divided capacitance between the substrate and the gate electrode. Here it holds that $C_0 >> C_2 >> C_1$. The inductances L denote the connection leads 24 (FIG. 1). For the sake of simplicity of the description, all these leads are connected to ground in FIG. 2.

If a voltage peak occurs on the grid $G_1$ (8) due to the above-mentioned flashover, it is coupled through to the substrate via $C_0$, which is indicated by line 15, so that this (viewed in FIG. 2) is raised in voltage at the left side. Since the RC network comprising the resistance elements R and the capacitance elements $C_1$, $C_2$ follows the voltage peak, as it were, an occurring voltage difference between the substrate and the gate electrode remains low at that area. At the area of the connection of the gate electrode (junction point 16) the voltage would remain practically equal to the ground level via the connection wire 24 if the resistor 17 were not present, so that a large voltage peak would occur between gate electrode and substrate. A breakdown could then occur, dependent on the duration and height of this voltage peak and the thickness and quality of the insulating material. It is found that voltage peaks of 2 kV or higher are not unusual, while destructive breakdown of, for example, silicon oxide of a conventional thickness already occurs at 200 to 300 V.

By providing a high-resistance resistor 17 according to the invention between the junction point 16 and the terminal 14, the same effect is achieved at the location of this junction point as described for the left half of FIG. 2. The effect known as bootstrap is, as it were, extended throughout the gate electrode. At a resistance of approximately 100 kohm of the resistor 17 voltage peaks of the order of approximately 80 V occur. In this case there is usually no destructive breakdown of the insulating layer.

Figure 3:
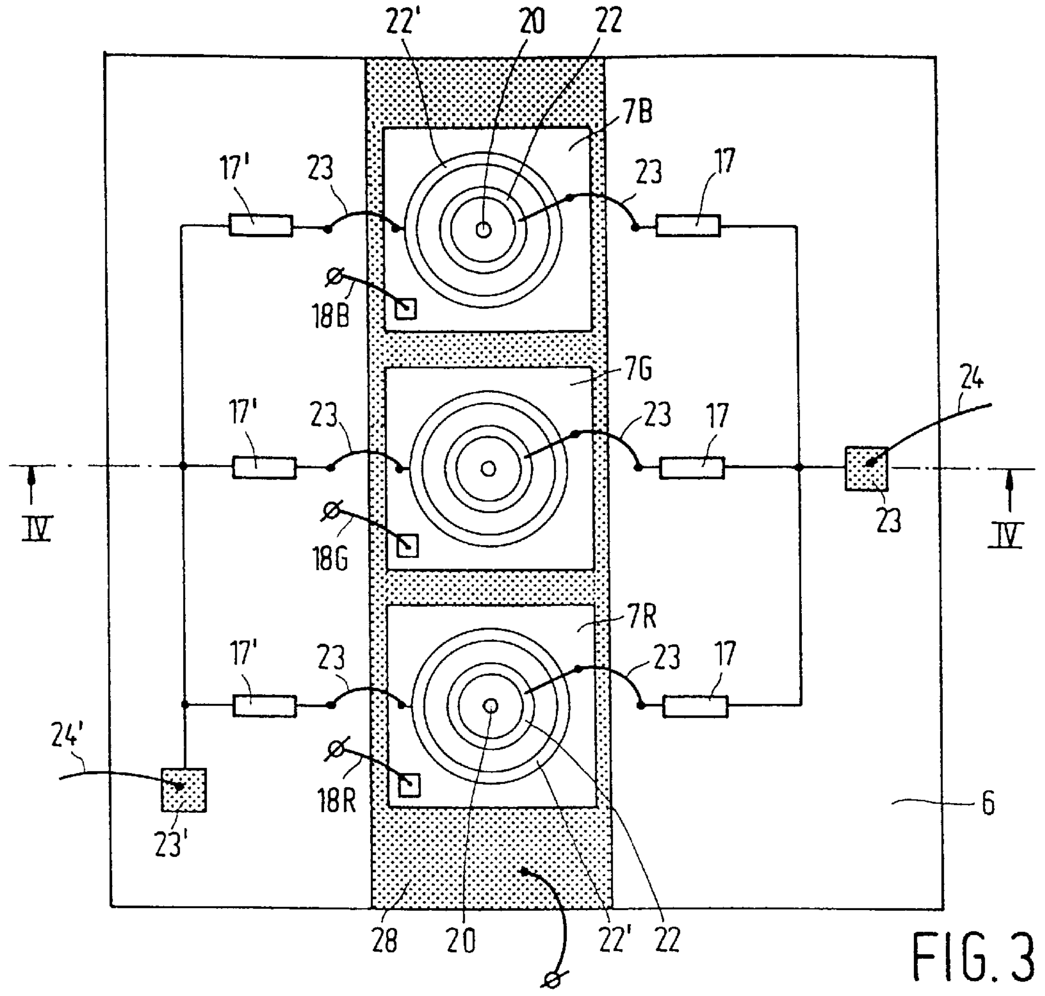
FIG. 3 shows diagrammatically an embodiment of a cathode support provided with semiconductor cathodes for use in a cathode ray tube according to the invention.
Figure 4:
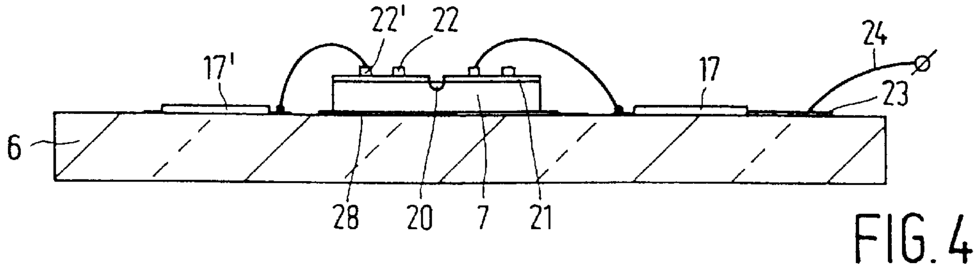
FIG. 4 shows a cross-section taken on the line IV—IV in FIG. 3.

FIG. 3 is a plan view and FIG. 4 is a cross-section taken on the line IV—IV in FIG. 3 of a practical embodiment of a cathode support provided with semiconductor cathodes for use in a cathode ray tube according to the invention. Three cathodes 7R, 7G, 7B supplying the electron beams for the colours red, green and blue, respectively, are mounted on a support 6 of a ceramic material (aluminium oxide) or, for example glass. Video signals 18R, 18G, 18B are applied to the cathodes via connection metallizations 19. The beam currents are modulated via these video signals, for example by modulation of the avalanche current in a cathode as described in U.S. Pat. No. 4,303,930. Gate or acceleration electrodes 22, 22' diagrammatically shown by means of rings in FIG. 3 are arranged around the actual emissive region 20 on an electrically insulating layer 21. If necessary, these electrodes may alternatively function as deflection electrodes and are made of, for example, polycrystalline silicon. The further structure of the cathodes 7 is not further shown in FIG. 6 for the sake of simplicity. The cathodes are contacted at their lower sides via a metallization 28.

The gate electrodes 22, 22' are connected via diagrammatically shown bonding wires 23 to (terminals of) resistors 17, 17' which may be implemented as, for example, thin-film resistors; a material (for example, nickel chromium) which is conventionally used in the thin-film technology is chosen as a resistive material. Although these resistors are shown as discrete resistors in this case, they may alternatively be implemented as an uninterrupted layer of resistive material of a suitable shape. The resistors 17, 17' have a resistance of 100 kOhm or more and are connected at their other terminals to common connections 24, 24', for example via connection metallization faces 23, 23'.

Since each cathode 7 has its own resistor 17 between the gate electrode 22 and the connection wire 23, mutual crosstalk between the cathodes is now considerably limited. An interference signal at, for example the connection 18R is capacitively coupled through to the gate electrode 22 of cathode 7R via the capacitance between the semiconductor substrate in which the cathode is realised and the gate electrode. Without the resistors 17 there would be a substantially ohmic connection between the gate electrodes 22 of the cathodes 7 so that the signal which has been coupled through would also influence the voltage at the gate electrodes 22. Due to the presence of the high-resistance resistors 17 a possibly occurring voltage peak at one of the gate electrodes 22 at the location of the common connection of the resistors 17 is already substantially eliminated so that said crosstalk has become negligible.

Figure 5:
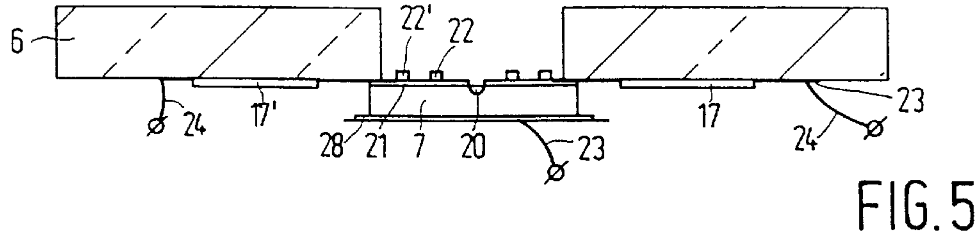
FIG. 5 shows a modification of FIG. 4.

FIG. 5 shows diagrammatically a modification of the arrangement of FIG. 4 in which the cathode 7 is mounted at the lower side of the support 6 (for example, by means of flip-chip mounting) and the support is apertured for passing the beam at the location of the cathode 7. The reference numerals in FIG. 5 further have the same significance as those in FIG. 4.

Figure 6:
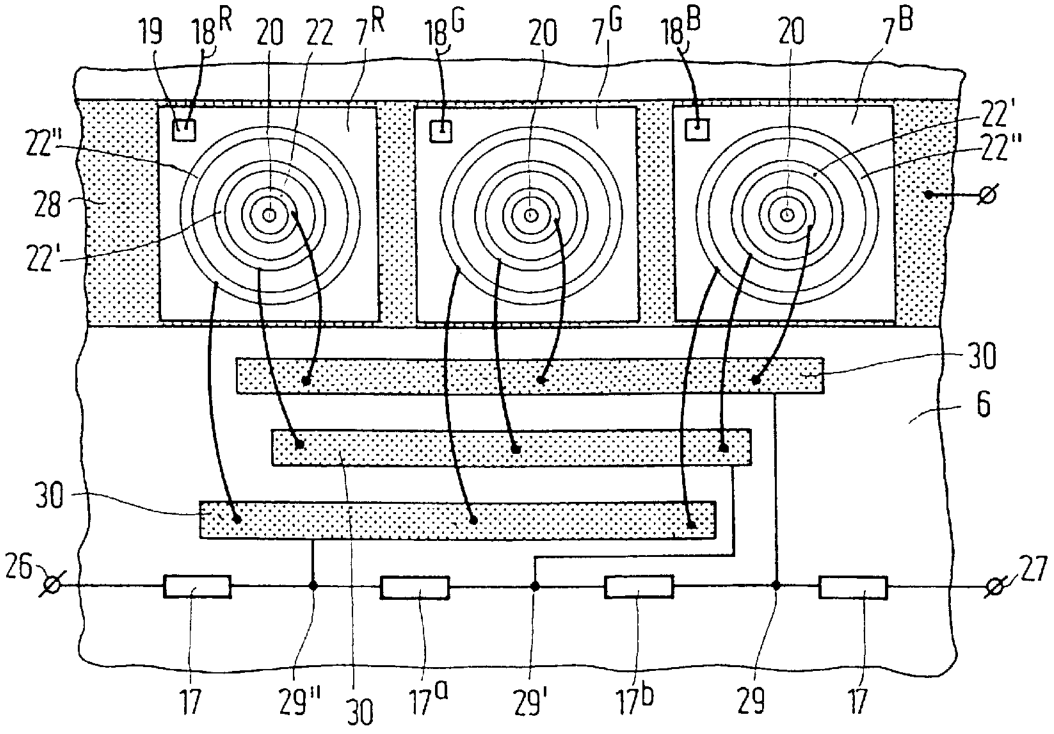

FIG. 6 shows another plan view in which the resistors 17, 17$^{a}$, 17$^{b}$, 17 constitute a voltage divider. The mutual ratios between the resistors are chosen to be such that, dependent on the voltages at the terminals 26, 27, the tappings 29, 29', 29" supply the correct voltages for the gate electrodes 22, 22', 22" of the three cathodes 7R, 7G, 7B. These tappings are connected to the gate electrodes via bonding wires 23 diagrammatically shown, in this example via metallization strips 30 provided on the support 6.

Figure 7:
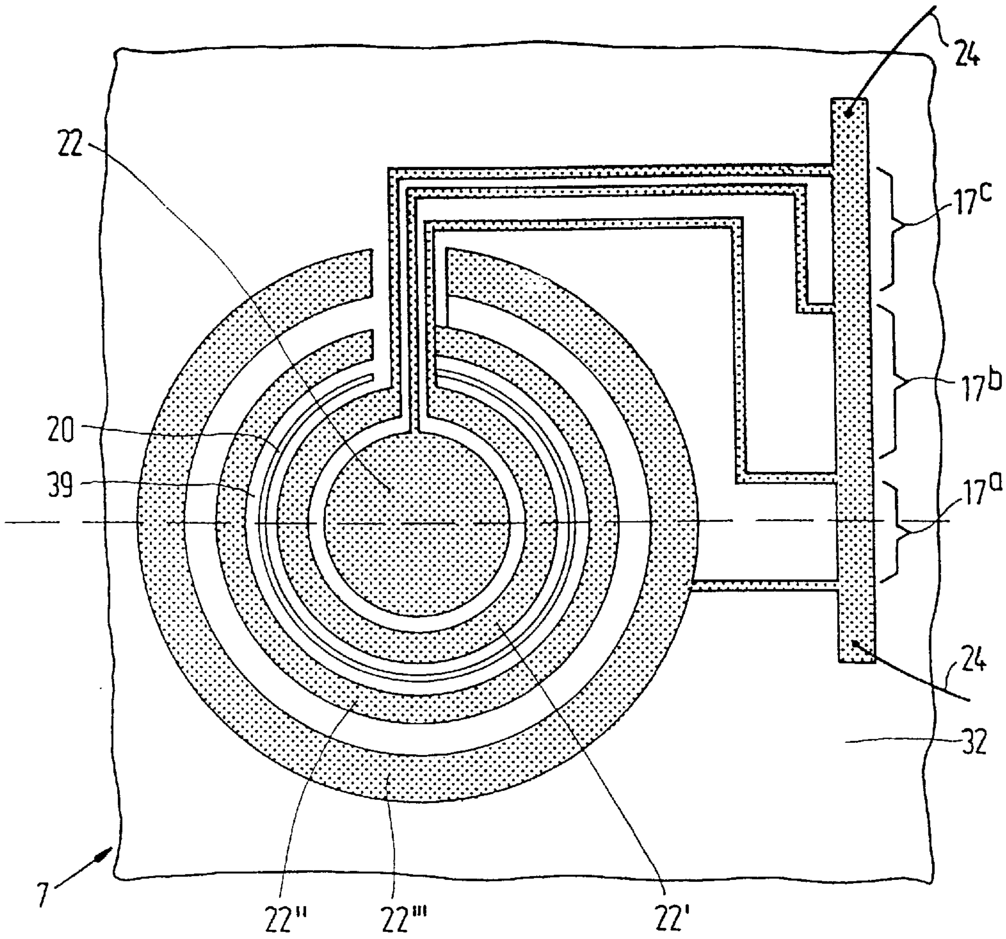
FIG. 7 is a plan view and FIG. 8 is a cross-section taken on the line VIII—VIII in FIG. 7 of a semiconductor cathode for use in a cathode ray tube according to the invention.
Figure 8:
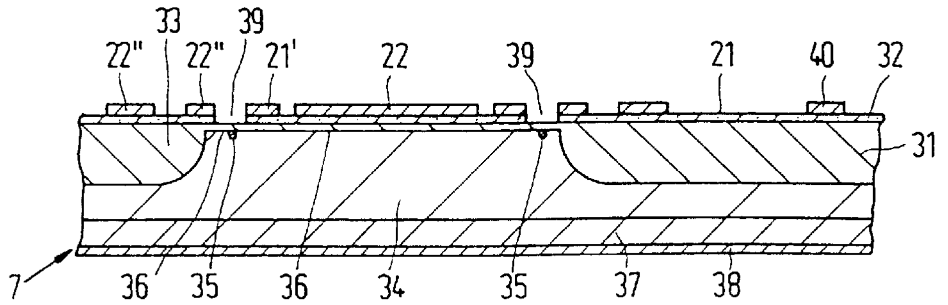

The resistance division shown may alternatively be realised with resistors of, for example, polycrystalline silicon provided on the insulating layer 21. This is shown in FIGS. 7 and 8. FIG. 7 is a diagrammatic plan view and FIG. 8 is a cross-section taken on the line VIII—VIII in FIG. 7 of a semiconductor device provided with such a resistive voltage divider. FIG. 8 also shows the structure of such a semiconductor device in greater detail than in the other examples.

The semiconductor cathode comprises a semiconductor body 31, in this example of silicon. It comprises at a main surface 32 of the semiconductor body an n-type surface region 33 which constitutes the pn junction 36 together with the p-type regions 34 and 35. The p-type region 37 and hence the emissive region 20 are chosen to be annular in this example. By applying sufficiently high voltages in the reverse direction across the pn junction, electrons are generated due to avalanche multiplication, which electrons may be emitted from the semiconductor body. The p-type region 35 is contacted at the lower side by a metal layer 38 in this example. This contact is preferably realised via a highly doped contact zone 37. In this example the donor concentration in the n-type region 33 at the surface is, for example $5.10^{19}$ atoms/cm$^3$, while the acceptor concentration in the p-type region 34 is much lower, for example $5.10^{16}$ atoms/cm$^3$. To decrease the breakdown voltage of the pn junction 36 locally, the semiconductor device is provided with a p-type region 35 of a higher doping, located within an aperture in the insulating layer 21 provided on the surface. For further details of such a semiconductor cathode reference is made to U.S. Pat. No. 4,303,930. In a plan view, gate electrodes 22, 22' are arranged within the circular aperture 39 (and the consequently bare emissive part 20), while (also in a plan view) gate electrodes 22", 22'" are present outside this aperture. A resistive strip 40 made of, for example polysilicon is present on the insulating layer 21. The parts of the resistive strip denoted by braces now fulfil the same function as the resistors 17$^{a}$, 17$^{b}$ in FIG. 6. The resistors 17 may also be mounted on a support again. To prevent breakdown of the insulating layer during spot-knocking, the ends of the resistive layer are connected to a terminal via the connection wire 24 (or a bonding wire, if the cathode is mounted on a support again) and a high-resistance resistor (not shown) when used in a cathode ray tube.

What is claimed is:

1. A cathode ray tube comprising a display window, grids and at least one semiconductor cathode for generating an electron beam, a main surface of a semiconductor body of said cathode being provided with an electrically insulating layer having at least one aperture at the location of an electron-emitting area, at least one gate or accelerator electrode being present on the electrically insulating layer, characterized in that the at least one gate or accelerator electrode is connected to a terminal via a resistor having a resistance of at least 100 kohm and the at least one semiconductor cathode and said resistor are present on a common support.

2. A cathode ray tube comprising at least one semiconductor cathode for generating an electron beam, a main surface of said cathode being provided with an electrically insulating layer having at least one aperture at the location of an electron-generating structure, at least one electrode for influencing the emissive electron beam being present on the electrically insulating layer, characterized in that the at least one electrode is connected to a terminal via a resistor having a resistance of at least 100 kohm and the at least one semiconductor cathode and said resistor are present on a common support.

3. A cathode ray tube comprising a display window, grids and a plurality of semiconductor cathodes for generating a plurality of electron beams, a main surface of a semiconductor body of each of said cathodes being provided with an electrically insulating layer having at least one aperture at the location of an electron-emitting area, at least one gate or accelerator electrode being present on the electrically insulating layer, characterized in that the at least one gate or insulating electrode is connected to a terminal via a resistor having a resistance of at least 100 kohm.

4. A cathode ray tube comprising a display window, a plurality of semiconductor cathodes for generating a plurality of electronic beams, a main surface of a semiconductor body of each of said cathodes being provided with an electrically insulating layer having at least one aperture at the location of an electron-emitting area and at least one electrode for influencing the electron beams being present on the electrically insulating layer, characterized in that the said at least one electrode is connected to a terminal via a resistor having a resistance of at least 100 kohm.

5. A cathode ray tube as claimed in claim 3, characterized in that the terminal is common for the different semiconductor cathodes.

6. A cathode ray tube as claimed in claim 3, characterized in that the common support also comprises a resistive voltage divider having tappings which are connected in an electrically conducting manner to gate or accelerator electrodes of the semiconductor cathode.

7. A cathode ray tube as claimed in claim 1, characterized in that a resistive voltage divider is present on the electrically insulating layer at the main surface of the semiconductor body, said resistive voltage divider having tappings which are connected in an electrically conducting manner to gate or accelerator electrodes of the semiconductor cathode.

8. A cathode ray tube as claimed in claim 2, characterized in that the resistive voltage divider comprises a resistive layer of polycrystalline silicon.

9. A cathode ray tube as claimed in claim 2, characterized in that the cathode ray tube comprises a plurality of semiconductor cathodes, each semiconductor cathode being connected to a terminal via a separate high-ohmic resistor.

10. A cathode ray tube as claimed in claim 4, characterized in that the cathode ray tube comprises a plurality of semiconductor cathodes, each semiconductor cathode being connected to a terminal via a separate high-ohmic resistor.

11. A cathode ray tube as claimed in claim 5, characterized in that the common support comprises a resistive voltage divider having tappings which are connected in an electrically conducting manner to gate or accelerator electrodes of the semiconductor cathode.

12. A cathode ray tube as claimed in claim 5, characterized in that a resistive voltage divider is present on the electrically insulating layer at the main surface of the semiconductor body, said resistive voltage divider having tappings which are connected in an electrically conducting manner to gate or accelerator electrodes of the semiconductor cathode.

* * * * *